United States Patent

Yamanaka

[11] Patent Number: 5,861,680
[45] Date of Patent: Jan. 19, 1999

[54] PHOTONIC DEVICE AND PROCESS FOR FABRICATING THE SAME

[75] Inventor: Hideo Yamanaka, Kanagawa, Japan

[73] Assignee: Sony Corporation, Tokyo, Japan

[21] Appl. No.: 716,113

[22] Filed: Sep. 19, 1996

[30] Foreign Application Priority Data

Sep. 29, 1995 [JP] Japan ................................. 7-252635

[51] Int. Cl.$^6$ .......................... H01L 23/28; H01L 23/52; H01L 29/40
[52] U.S. Cl. .......................... 257/793; 257/787; 257/788; 257/795
[58] Field of Search .................................. 257/793, 788, 257/791, 795, 787, 432, 433, 783; 438/26, 15

[56] References Cited

FOREIGN PATENT DOCUMENTS 63-168042  7/1988  Japan ...................................... 257/788
2-260649  10/1990  Japan ...................................... 257/788

*Primary Examiner*—Mahshid D. Saadat
*Assistant Examiner*—Jhihan B. Clark
*Attorney, Agent, or Firm*—Hill & Simpson

[57] ABSTRACT

A photonic device according to the present inventions obtained by resin molding a photonic element mounted on a base using a light-transmitting resin wherein the cured hardness of the light-transmitting resin is set at a value for optimally minimizing the adhesion of dust particles on the surface of the light-transmitting resin and the generation rate of internal cracks of the light-transmitting resin for a predetermined temperature change on the basis of the correlation between the two. A process for fabricating a photonic device according to the present invention comprises resin molding a photonic element by potting a light-transmitting resin having a predetermined viscosity, and applying a predetermined heat treatment for curing the resin to a final hardness after driving out the bubbles from the inside of the light-transmitting resin and for relaxing the curing shrinkage stress.

12 Claims, 2 Drawing Sheets

A graph explaining the optimal hardness

DIP TYPE

LCC TYPE

A graph explaining the optimal hardness

PHOTONIC DEVICE AND PROCESS FOR FABRICATING THE SAME

BACKGROUND OF THE INVENTION

1. Field of the Invention

The present invention relates generally to the field of CCD imaging devices and, more particularly, the present invention relates to a photonic device obtained by potting a photonic element mounted on a base using a light-transmitting resin, and a process for fabricating the same.

2. Description of the Related Art

Photonic devices such as CCD (charge-coupled device) linear sensors or a CCD area sensors have been fabricated heretofore into a final product by first die bonding a chip of a photonic element inside a hollow package made of a ceramics or an epoxy resin. Then an interconnection is formed using a bonding wire, and realizing an air-tight seal by using a seal glass.

Recently, for reducing cost, photonic devices have been obtained by resin molding a photonic element and bonding wires inside the hollow portion of the hollow package described above by means of potting using a light-transmitting resin and by resin molding a photonic element and bonding wires inside a resin dam formed on an LCC (Leadless Chip Carrier) substrate by means of potting a light-transmitting resin. In the aforementioned photonic devices and the processes for producing them, however, the initial viscosity and the cured hardness of the light-transmitting resin for use in potting greatly influenced the yield, the quality, and the reliability of the resultant product. That is, for example, when the initial viscosity of the light-transmitting resin is too high gas is undesirably absorbed. For example, gas is absorbed by the base material that is used in die bonding, the residual air remaining in the interstices between the photonic element and the base, the gas included in the light-transmitting resin, the air included during potting, etc., tend to remain in the light-transmitting resin and form bubbles. Those residual bubbles result in a device having poor photosensitivity.

If the hardness after curing is too low, the surface of the light-transmitting resin is liable to be so viscous and sticky that dust particles collect and adhere. Even if attempts are made to blow off the dust particles attached to the surface by using air blowing and the like, the dust particles around the resin tend to adversely adhere thereto and cause defects. Furthermore, when the light-transmitting resin is excessively soft, an attempt to wipe off dust particles adhered to the surface by using a cotton swab (with alcohol) causes deformation of the light-transmitting resin that results in breakage or deformation of the internal bonding wires.

In contrast, if the light-transmitting resin becomes too hard after curing, the stickiness on the surface of the light-transmitting resin is reduced and the adhesion of dust particles is decreased. However, when reliability evaluation is performed at a predetermined temperature cycle, high thermal stress and the resulting strain due to high hardness causes breakage of the bonding wires and frequent internal resin cracks.

SUMMARY OF THE INVENTION

The present invention provides a photonic device and a process for fabricating the same to overcome the aforementioned problems. More specifically, a photonic device according to the present invention is obtained by sealing a photonic element using a light-transmitting resin with the optical element being mounted on a base, and then curing the light-transmitting resin, wherein the hardness of the light-transmitting resin after curing is obtained as a value based on the correlation between the adhesion of dust particles on the surface of the light-transmitting resin and the generation rate of internal cracks of the light-transmitting resin at a predetermined temperature change.

A process for fabricating a photonic device according to the present invention comprises the steps of forming a predetermined wiring on a photonic element with the element being mounted on a base; sealing the photonic element by potting using a light-transmitting resin having a predetermined viscosity; and performing a predetermined heating treatment, thereby driving out the bubbles from the inside of the light-transmitting resin and curing the light-transmitting resin to a final hardness by relaxing the curing shrinkage stress.

In the photonic device described above, the hardness after curing the light-transmitting resin for use in resin molding an photonic element is obtained as having a value for optimally minimizing the adhesion of dust particles on the surface of the light-transmitting resin and the generation ratio of internal cracks of the light-transmitting resin at a predetermined temperature change on the basis of the correlation between the two. Accordingly, dust particle adhesion on the surface of the light-transmitting resin and the generation rate of internal cracks can both be reduced at the same time.

In the process for fabricating the photonic device described above, potting a light-transmitting resin having a predetermined viscosity is performed to suppress the generation of internal bubbles, and a heat treatment is applied to drive out the internal bubbles generated in the resin while gradually relaxing the stress that occurred in the resin shrinking during curing. Furthermore, a photonic device with improved reliability is finally obtained, because the heat treatment finally provides a surface hardness which reduces the adhesion of dust particles on the surface of the light-transmitting resin and which is also capable of reducing the generation of internal cracks under a predetermined temperature change.

DETAILED DESCRIPTION OF THE PREFERRED EMBODIMENTS

Figure 1A:
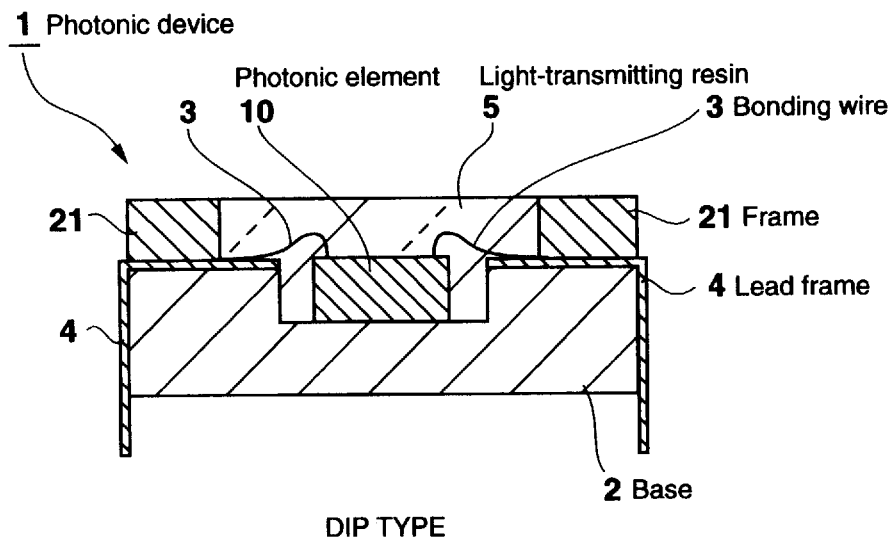
FIGS. 1 (a) and 1 (b) are schematic cross sectional diagrams for the embodiments of the present invention, where FIG. 1 (a) illustrates a DIP type device and FIG. 1 (b) illustrates an LCC type device.
Figure 1B:
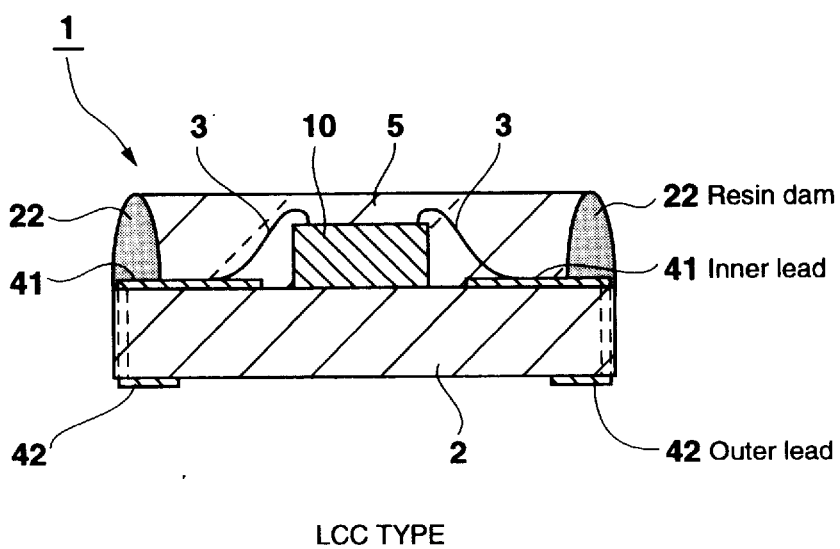

FIG. 1 illustrates a schematic cross sectional view of a photonic device according to an embodiment of the present invention, wherein FIG. 1 (a) shows a DIP type device and FIG. 1 (b) shows an LCC type package. Referring to FIG. 1 (a), a DIP type photonic device 1 comprises a base 2 and a frame 21 made of, for instance, a ceramic, an epoxy resin, PPS (polyphenylene sulfide), or a liquid crystal polymer material. A lead frame 4 made of, for example, 42 Alloy (an alloy containing 42% nickel and iron) is interposed between the base 2 and the frame 21. A photonic element 10 such as a CCD image sensor is die bonded approximately at the center of the base 2. A bonding wire 3 made of, for example, a gold wire or an aluminum wire, connects the photonic element 10 with the lead frame 4. A light-transmitting resin 5 comprising, for instance, a silicone resin is applied over the photonic element 10 and the bonding wire 3.

Referring to FIG. 1 (b), an LCC type photonic device 1 comprises a planar base 2 made of, for instance, a ceramic, a glass epoxy material, PPS (polyphenylene sulfide), or a liquid crystal polymer material. A resin darn 22 made of a silicone resin is disposed around the periphery of the base 2. An inner lead 41 and an outer lead 42 are attached to the base 2. A photonic element 10 is die bonded approximately at the center of the base 2 and a bonding wire 3 electrically connects the photonic element 10 with the inner lead 41. A light-transmitting resin 5 is used for potting the photonic element 10 and the bonding wire 3 inside the resin dam 22.

Both of the two types of photonic devices of FIGS. 1 (a) and (b) according to the present embodiment are characterized in that the cured hardness of the light-transmitting resin 5 for use in potting the photonic element 10 and the bonding wire 3 is set on the basis of correlation between the adhesion of dust particles on the surface of the light-transmitting resin 5 and the generation rate of internal cracks of the light-transmitting resin 5 at a predetermined temperature change.

Figure 2:
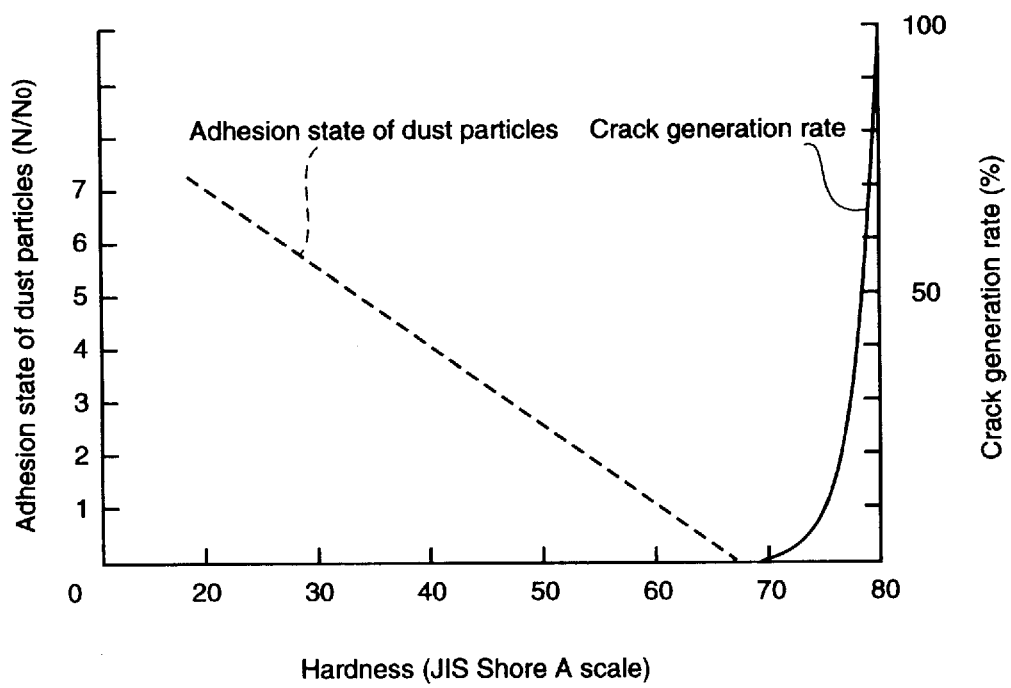
FIG. 2 is a graph which illustrates optimal hardness.

FIG. 2 is a graph which explains the optimum hardness in the case that the light-transmitting resin 5 (see FIG. 1 is a silicone resin. More specifically, in the graph of FIG. 2, the abscissa shows the hardness (JIS Shore A scale hardness) of the cured light-transmitting resin 5. The ordinate on the left side shows the adhesion state of dust particles on the surface of the light-transmitting resin 5, and the ordinate on the right side shows the generation rate of internal cracks of the light-transmitting resin 5 under a predetermined temperature change.

In FIG. 2, the "adhesion state of dust particles" on the left ordinate is the ratio (N/NO) of the number of dust particles (N) counted after air blowing to the number of dust particles (NO) counted after leaving the photonic device 1 (see FIG. 1) to stand inside a room for a predetermined duration of time. The "generation rate of internal cracks" on the right ordinate is the generation rate (%) of internal cracks of a light-transmitting resin 5 subjected to a 100 cycles of temperature change in a range of from −55° C. to 125° C.

Referring to FIG. 2, the broken lines shown in the figure shows that the adhesion state of dust particles is expressed by the tendency of the ratio (N/NO) which gradually decreases with increasing hardness. On the other hand, solid line in FIG. 2 shows that the generation rate of cracks increases abruptly when the hardness exceeds 70. It can be seen from these facts that the adhesion state of dust particles and the generation rate of internal cracks are closely correlated with hardness. Accordingly, the cured hardness of the light-transmitting resin 5 of the photonic device 1 as shown in FIGS. 1 (a) and 1 (b) is set in accordance with the correlation shown in FIG. 2.

Referring to FIG. 2, for instance, the adhesion state of less dust particles (as is observed by the N/NO ratio of not higher than 1) is in a hardness range of from 60 to 70 with a crack generation rate of 0%. Thus, by setting the hardness of the cured light-transmitting resin 5 in a range of from 60 to 70 in the optical devices 1 shown in FIGS. 1(a) and 1 (b), the dust particles adhered on the surface of the resin can be easily blown off by air blowing, while preventing the generation of internal cracks under a predetermined temperature change.

FIG. 2 shows an example in which a silicone resin is used as the light-transmitting resin 5. In case of using resins or package types other than those described above, the adhesion state of dust particles and the crack generation rate change accordingly. Thus, in the present embodiment, the hardness of the cured light-transmitting resin 5 should be set at the optimal value for providing a low adhesion state of dust particles with no crack generation depending on the conditions such as the properties of the resin to be used or the package shapes.

A process for fabricating a photonic device according to an embodiment of the present invention is described below. First, referring to FIG. 1 (a), the fabrication process for a DIP type photonic device is described. A DIP type photonic device 1 is fabricated by first forming a hollow package comprising a base 2 and a frame 21 with a lead frame 4 interposed therebetween.

More specifically, when ceramic material is used for the base 2 and the frame 21, the hollow package is fabricated by baking. In the case where epoxy resin is used, the hollow package is fabricated by transfer molding or injection molding. In the case where PPS or a liquid crystal polymer material is used, the hollow package is obtained by injection molding.

A chip of a photonic element 10 such as a CCD image sensor is die bonded approximately at the center portion of the base 2 of thus obtained hollow package by using a paste material. Then, the photonic element 10 is connected with the inner lead of the lead frame 4 by using a bonding wire 3. The inner lead portion of the lead frame has a clad layer of, for example, aluminum which ensures wire bonding. The outer lead portion of the lead frame 4 is previously subjected to plating using, for instance, tin or a solder. Then, the photonic element 10 and the bonding wire 3 are resin molded by potting a light-transmitting resin 5, for example, a silicone resin, inside the hollow package, i.e., inner side of the frame 21, in which the photonic element 10 has been die-bonded and wired using the bonding wire 3. In performing potting, the initial viscosity of the light-transmitting resin 5 is set at, for example, 30 Poise or lower (preferably, 20±5 Poise) at a temperature of 25° C. In this manner, the generation of bubbles due to the inclusion of air at potting the light-transmitting resin 5, the residual air remaining in the interstices between the photonic element 10 and the base 2, and the gas included inside the resin, etc., can be reduced.

After finishing potting of the light-transmitting resin 5 at the initial viscosity above, the resin is cured by a predetermined heat treatment. The heat treatment comprises prebaking at a temperature in a range of from 70° to 80° C. for a duration of about 1 hour for performing so-called degassing, i.e., driving out the bubbles that have generated during the potting; followed heating at a temperature range of from 110° to 120° C. for a duration of about 1 hour to gel the light-transmitting resin 5, thereby gradually relaxing the stress which have generated by shrinking at curing; and post baking at 150° C. for a duration of from about 3 to 4 hours for achieving final hardness. As described previously, the achieved hardness is set at a value based on the correlation between the adhesion state of dust particles on the surface and the generation rate of internal cracks of the light-transmitting resin 5.

In the case where a light-transmitting resin 5 is used other than those rendered thixotropic by the addition of fillers, i.e., in the case where a light-transmitting resin 5 is used to which no filler has been added, wrinkles generate on the surface of the resin by the hot air blown at heating. Since these wrinkles are the cause of uneven photonic sensitivity, the generation of wrinkles must be prevented during heating by applying a shield against hot air.

The curing is performed by gradually heating and gradually cooling the entire structure. More specifically, for instance, the structure is heated up gradually in the prebaking stage in the temperature range of from 70° to 80° C., heated up gradually again from the stage in the temperature range of 70° to 80° C. to a stage in a temperature range of from 110° to 120° C., and further heated up gradually from the stage of 110° to 120° C. to a stage of 150° C. After post curing, the cured product is gradually cooled to a temperature range of from 70° to 80° C., and is taken out from the furnace. In this manner, the stress due to the shrinkage on curing can be reduced.

With this manufacturing method, a DIP type photonic device 1 is completed in which the light-transmitting resin 5 has an optimal hardness such that the light-transmitting resin 5 is free of bubbles remaining inside the resin and further free of the generation of resin cracks or resin separation due to curing shrinkage stress.

Referring to FIG. 1 (b), the fabrication process for an LCC type photonic device is described below. An LCC type photonic device 1 is fabricated by first fabricating an LCC substrate comprising a planar base 2 on which an inner lead 41 and an outer lead 42 are formed. In the case where ceramic material is used for the base 2, for example, metallized patterns of tungsten or the like for an inner lead 41 and an outer lead 42 are formed on a given green sheet, and then baked to obtain the LCC substrate.

In the case where a glass epoxy material is used, an inner lead 41 and an outer lead 42 are patterned by performing a predetermined etching process of copper thin film. The surfaces of the resulting inner lead 41 and outer lead 42 are covered with a nickel-gold plating (for instance, a 10 μm thick nickel and a 0.5 μm thick gold).

A chip of an photonic element 10 such as a CCD image sensor is die bonded approximately at the center portion of the base 2 of thus obtained LCC substrate by using a paste material. Then, the photonic element 10 is connected with the inner lead 41 by using a bonding wire 3 made of, for instance, a gold wire. A resin dam 22 is formed thereafter around the bonding wire 3 at the periphery. A fast-curing type two-pack silicone resin which is highly thixotropic is used as the resin dam 22. The initial viscosity of the resin at 25° C. is set at, for instance, 400 Poise, and the hardness after curing is set at a value higher than that of the light-transmitting resin 5 to be described later (for example, at a JIS Shore A scale hardness of from 60 to 70 or higher).

After forming the resin dam 22, the photonic element 10 and the bonding wire 3 are resin molded by potting a light-transmitting resin 5 consisting of, for example, a silicone resin, inside the resin dam 22. In performing potting, the initial viscosity of the light-transmitting resin 5 is set at, for example, 30 Poise or lower (preferably, 20±5 Poise) at the temperature of 25° C. In this manner, the generation of bubbles due to inclusion of air at potting the light-transmitting resin 5, the residual air in the interstices between the photonic element 10 and the base 2, and the gas included inside the resin, etc., can be reduced.

After potting the light-transmitting resin 5 inside the resin dam 22, a heat treatment similar to that described for the case of DIP type is performed to simultaneously cure the resin dam 22 and the light-transmitting resin 5. More specifically, the heat treatment comprises prebaking at a temperature in a range of from 70° to 80° C. for a duration of about 1 hour for performing so-called degassing, followed heating at a temperature range of from 110° to 120° C. for a duration of about 1 hour to relax the curing shrinkage stress, and post baking at 150° C. for a duration of about 3 to 4 hours for achieving the final hardness.

Gradual heating, gradual cooling, and curing using a hot air shield during the heat treatment are performed in the same manner as those for the case of a DIP type photonic device described above. Similar to the foregoing case, the final hardness is set at a value based on the correlation between the adhesion state of dust particles on the surface and the generation rate of internal cracks of the light-transmitting resin 5. Thus, with this manufacturing method, an LCC type photonic device 1 is completed in which the light-transmitting resin 5 has an optimal hardness such that the light-transmitting resin 5 is free of bubbles remaining inside the resin and further free of the generation of resin cracks or resin separation due to curing shrinkage stress. As described in the foregoing, the resin dam 22 is harder than the light-transmitting resin 5. Thus, upon completion of the photonic device 1, the bonding wire 3 inside the light-transmitting resin 5 does not break nor deform even in case where an external force is applied to the resin dam 2.

In whichever type of photonic device above, the specific values for the initial viscosity, the cured hardness, and the heat treatment conditions of curing for the light-transmitting resin 5 are given only as examples. Thus, the present invention is not limited thereto. Although the embodiments above refer to the case using silicone resin as the light-transmitting resin, similar devices can be provided in the cases of using an epoxy resin or an acrylic resin. Furthermore, the photonic element 10 is not limited to the chip for the CCD linear sensor or the CCD area sensors, but may also be an LED chip or a semiconductor laser chip.

As described in the foregoing, the photonic device and the process for fabricating the same according to the present invention have the following effects. That is, because the cured hardness of the light-transmitting resin for use in the photonic device according to the present invention is set on the basis of the correlation between the adhesion of dust particles on the surface of the light-transmitting resin and the generation rate of internal cracks of the light-transmitting resin at a predetermined temperature change, the dust particles adhered to the light-transmitting resin surface of the completed device can be easily removed. Thus, the present invention provides a highly reliable device which is free from generating resin cracks, resin separations, and breakage of bonding wires even in case of temperature changes.

In the process for fabricating a photonic device according to the present invention, residual bubbles can be eliminated and the internal stress at curing shrinking can be relaxed by adjusting the viscosity of the light-transmitting resin for use in potting and by performing heat treatment at curing. Accordingly, the product yield and quality can be improved.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim:

1. A photonic device comprising:
   a base;
   a photonic element mounted on said base;
   a cured light-transmitting resin formed on the photonic element;
   and wherein a hardness of said cured light-transmitting resin is determined by minimizing adhesion of dust particles on a surface of said cured light-transmitting resin while eliminating the generation of internal cracks in said cured light-transmitting resin at a predetermined temperature range, wherein said hardness is in a range of between 60 and 70 JIS Shore A hardness.

2. A photonic device according to claim 1, wherein said light-transmitting resin is a silicone resin.

3. A photonic device according to claim 1, wherein said light-transmitting resin is an epoxy resin.

4. A photonic device according to claim 1, wherein said light-transmitting resin is an acrylic resin.

5. The photonic device of claim 1, wherein the hardness of the cured light-transmitting resin is selected so that the adhesion of dust particles is at least substantially eliminated and the generation of internal cracks is also at least substantially eliminated.

6. The photonic device of claim 1, wherein the hardness of the cured light-transmitting resin is selected so that the adhesion of dust particles is eliminated and the generation of internal cracks is also eliminated.

7. A photonic device comprising:

a base;

a photonic element mounted on said base;

a cured light-transmitting resin formed on the photonic element;

and wherein a hardness of said cured light-transmitting resin substantially minimizes the adhesion of dust particles on a surface of said cured light-transmitting resin and substantially eliminates the generation of internal cracks in said cured light-transmitting resin, wherein said hardness is in a range of between 60 and 70 JIS Shore A hardness.

8. A photonic device according to claim 7, wherein said light-transmitting resin is a silicone resin.

9. A photonic device according to claim 7, wherein said light-transmitting resin is an epoxy resin.

10. A photonic device according to claim 7, wherein said light-transmitting resin is an acrylic resin.

11. The photonic device of claim 7, wherein the hardness of the cured light-transmitting resin is selected so that the adhesion of dust particles is at least substantially eliminated and the generation of internal cracks is also at least substantially eliminated.

12. The photonic device of claim 7, wherein the hardness of the cured light-transmitting resin is selected so that the adhesion of dust particles is eliminated and the generation of internal cracks is also eliminated.

* * * * *